United States Patent
Tanimura et al.

(10) Patent No.: US 10,985,021 B2
(45) Date of Patent: Apr. 20, 2021

(54) METHOD FOR FABRICATING P-TYPE GALLIUM NITRIDE SEMICONDUCTOR AND METHOD OF HEAT TREATMENT

(71) Applicant: SCREEN HOLDINGS CO., LTD., Kyoto (JP)

(72) Inventors: Hideaki Tanimura, Kyoto (JP); Takahiro Yamada, Kyoto (JP); Shinichi Kato, Kyoto (JP); Takayuki Aoyama, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/519,558

(22) Filed: Jul. 23, 2019

(65) Prior Publication Data
US 2020/0066532 A1    Feb. 27, 2020

(30) Foreign Application Priority Data

Aug. 27, 2018   (JP) .............................. JP2018-158435

(51) Int. Cl.
*H01L 21/324*    (2006.01)
*H01L 21/265*    (2006.01)
*H01L 21/687*    (2006.01)

(52) U.S. Cl.
CPC .... *H01L 21/26546* (2013.01); *H01L 21/3245* (2013.01); *H01L 21/6875* (2013.01); *H01L 21/68707* (2013.01)

(58) Field of Classification Search
CPC ......... H01L 21/26546; H01L 21/68707; H01L 21/6875; H01L 21/3245

(Continued)

(56) References Cited

U.S. PATENT DOCUMENTS

2007/0010072 A1* 1/2007 Bailey ................... C23C 16/308
                                                            438/478
2007/0029558 A1    2/2007 Nishizono
(Continued)

FOREIGN PATENT DOCUMENTS

JP       2007-042898 A    2/2007
KR   10-2002-0056566 A    7/2002
(Continued)

OTHER PUBLICATIONS

Taiwanese Office Action issued in corresponding Taiwanese Patent Application No. 108123199, dated Sep. 4, 2020, with English translation of the Japanese translation of the Taiwanese Office Action.

(Continued)

*Primary Examiner* — Elias Ullah
(74) *Attorney, Agent, or Firm* — McDermott Will & Emery LLP

(57) ABSTRACT

A gallium nitride (GaN) substrate is injected with magnesium as a p-type dopant. The GaN substrate undergoes preheating through irradiation with light from halogen lamps in an atmosphere containing nitrogen and hydrogen, and further undergoes heating to a high temperature for a super-short time through irradiation with flashes of light from flash lamps. Heating the GaN substrate in the atmosphere containing nitrogen and hydrogen complements removed nitrogen, thus preventing nitrogen shortage. Such a heating process also enables heat treatment while supplying hydrogen to the GaN substrate. The heating process further enables crystal defects in the GaN substrate to be recovered. With these effects, the p-type dopant injected into the GaN substrate is activated with high efficiency.

6 Claims, 9 Drawing Sheets

(58) Field of Classification Search
USPC .......................................................... 438/522
See application file for complete search history.

(56) References Cited

U.S. PATENT DOCUMENTS

| | | | |
|---|---|---|---|
| 2015/0099350 A1* | 4/2015 | Srinivasan | .......... H01L 21/3245 |
| | | | 438/522 |
| 2017/0011923 A1 | 1/2017 | Tanimura et al. | |
| 2018/0166281 A1 | 6/2018 | Fuse et al. | |

FOREIGN PATENT DOCUMENTS

| | | |
|---|---|---|
| KR | 10-2018-0067413 A | 6/2018 |
| TW | 201310538 A | 3/2013 |
| TW | 201705296 A | 2/2017 |

OTHER PUBLICATIONS

Korean Notification of Reason for Refusal issued in corresponding Korean Patent Application No. 10-2019-0092345, dated Aug. 11, 2020, with English translation.
Korean Notification of Reason for Refusal issued in corresponding Korean Patent Application No. 10-2019-0092345, dated Feb. 25, 2021, with English translation.

* cited by examiner

F I G . 4
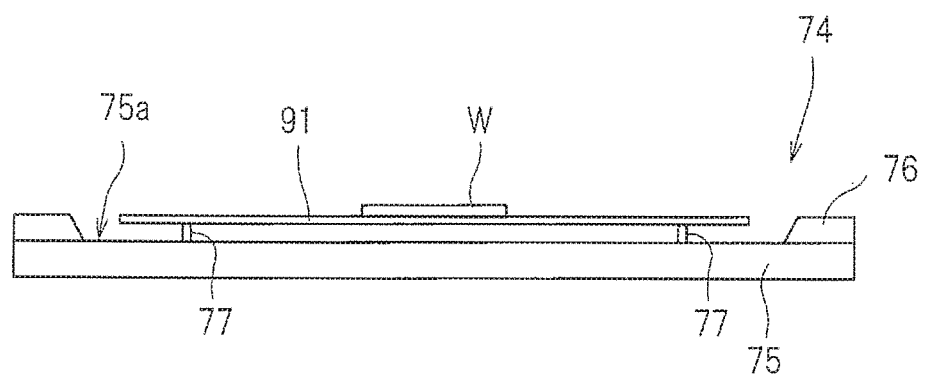

F I G. 7
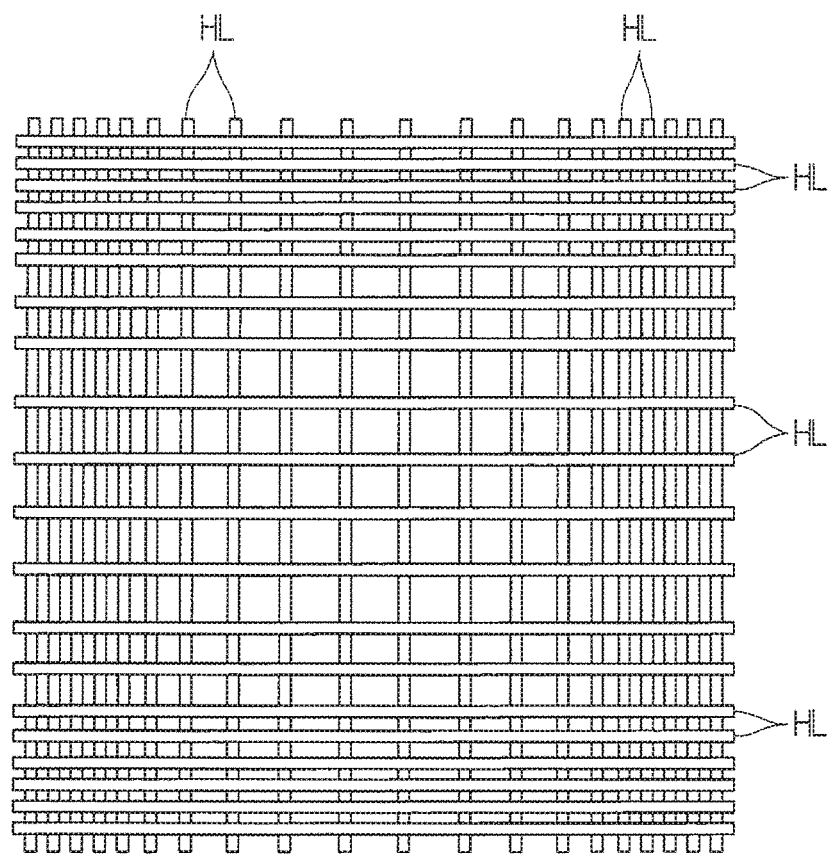

METHOD FOR FABRICATING P-TYPE GALLIUM NITRIDE SEMICONDUCTOR AND METHOD OF HEAT TREATMENT

BACKGROUND OF THE INVENTION

Field of the Invention

The present invention relates to a method for fabricating a p-type gallium nitride semiconductor and a method of heat treatment both of which provide an activated p-type dopant injected to a gallium nitride (GaN) substrate.

Description of the Background Art

Gallium nitride compounds receive attention as blue-light emitting elements and are promising as a basic material for power devices for power conversion. For instance, United States Patent Application Publication No. 2007/0029558 discloses a method of fabricating a gallium nitride compound semiconductor by activating impurities added to into a gallium nitride compound.

As disclosed in United States Patent Application Publication No. 2007/0029558, for an n-type gallium nitride semiconductor, doping a gallium nitride compound with, for instance, Si or silicon (i.e., an n-type dopant) activates the dopant relatively easily. This provides an n-type gallium nitride semiconductor of high quality. On the other hand, a p-type gallium nitride semiconductor of as high quality as an n-type gallium nitride semiconductor cannot be fabricated by merely doping a gallium nitride compound with, for instance, Mg or magnesium (i.e., a p-type dopant). This is because the p-type dopant within the gallium nitride compound has low activation rate.

SUMMARY

The present invention is directed to a method for fabricating a p-type gallium nitride semiconductor.

According to one aspect of the present invention, the method includes the following process steps: (a) injecting a p-type dopant into a substrate of gallium nitride; and (b) heating the substrate by irradiating the substrate with a flash of light for less than one second in an atmosphere containing nitrogen and hydrogen.

Such a configuration enables the substrate to be supplied with hydrogen for heat treatment while preventing nitrogen shortage in the substrate, thereby activating the p-type dopant with high efficiency.

The present invention is also directed to a method for heating a gallium nitride substrate.

According to one aspect of the present invention, the method includes the following process steps: (a) transporting a substrate of gallium nitride injected with a p-type dopant into a chamber; (b) forming, in the chamber, an atmosphere containing nitrogen and hydrogen; and (c) heating the substrate by irradiating the substrate with a flash of light for less than one second.

Such a configuration enables the substrate to be supplied with hydrogen for heat treatment while preventing nitrogen shortage in the substrate, thereby activating the p-type dopant with high efficiency.

As such, an object of the present invention is to highly efficiently activate a p-type dopant injected to gallium nitride.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of the susceptor;

FIG. 7 is a plan view illustrating an arrangement of halogen lamps;

DESCRIPTION OF THE PREFERRED EMBODIMENT

The preferred embodiment of the present invention will be detailed with reference to the drawings.

Figure 1:
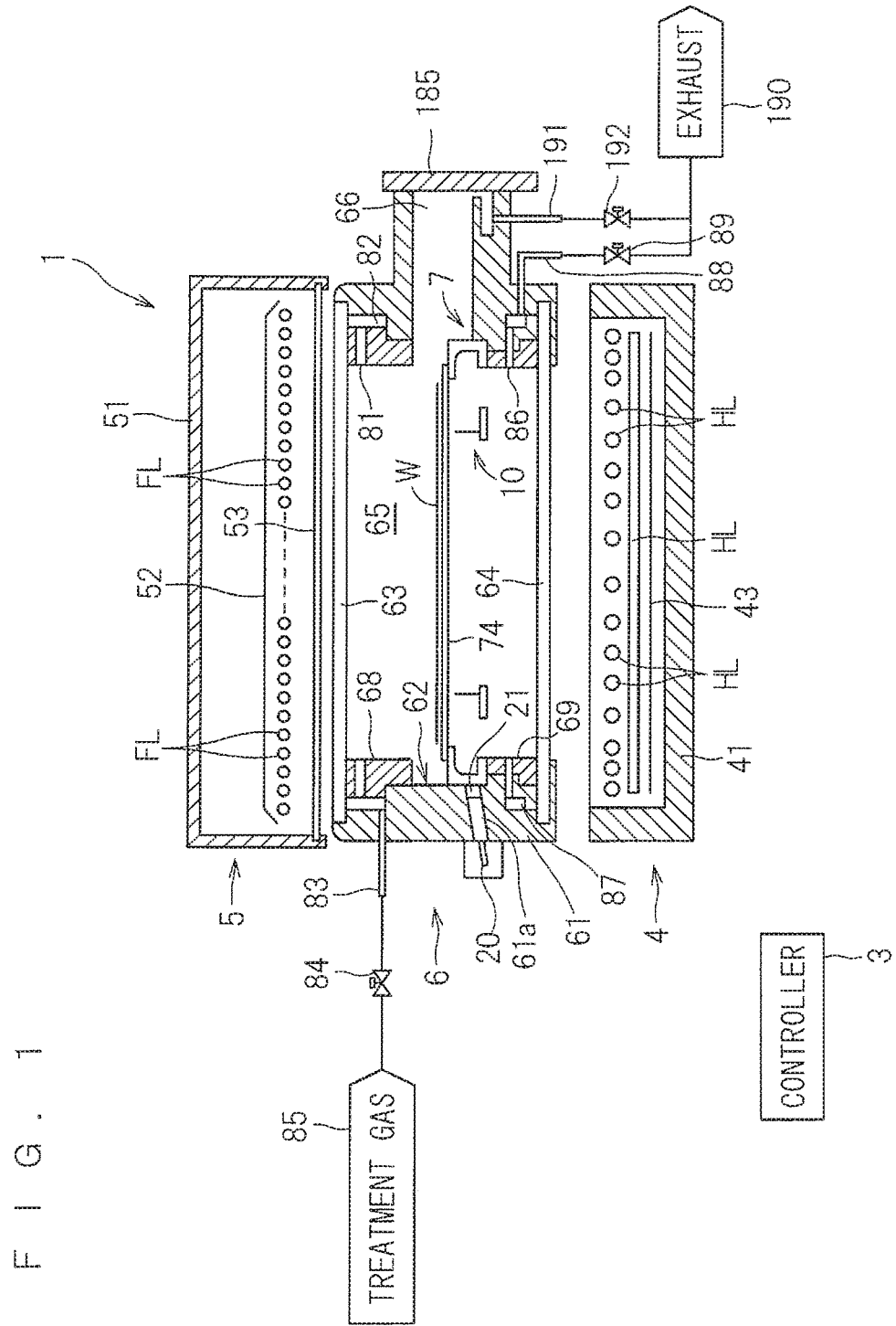
FIG. 1 is a longitudinal cross-sectional view illustrating the configuration of a heat treatment apparatus for use in carrying out a method of heat treatment according to a preferred embodiment.

The following describes a heat treatment apparatus for carrying out a method of heat treatment according to the present invention. FIG. 1 is a longitudinal cross-sectional view illustrating the configuration of a heat treatment apparatus 1 for use in carrying out the method of heat treatment according to the present invention. The heat treatment apparatus 1 in FIG. 1 is a flash lamp annealer that irradiates a gallium nitride substrate (hereinafter, referred to as a GaN substrate) W with flashes of light to heat the GaN substrate W. For easy understanding, FIG. 1 and the other drawings exaggerate or simplify the size of individual components and the number of components, as necessary.

The heat treatment apparatus 1 includes a chamber 6 accommodating the GaN substrate W, a flash heating part 5 including a plurality of built-in flash lamps FL, and a halogen heating part 4 including a plurality of built-in halogen lamps HL. The flash heating part 5 is disposed over the chamber 6, and the halogen heating part 4 is disposed under the chamber 6. The heat treatment apparatus 1 also includes a holder 7 disposed in the chamber 6 and holding the GaN substrate W in a horizontal attitude, and a transfer mechanism 10 that transfers the GaN substrate W between the holder 7 and the outside of the heat treatment apparatus 1. The heat treatment apparatus 1 further includes a controller 3 that controls respective operating mechanisms included in the halogen heating part 4, the flash heating part 5, and the chamber 6 to heat the GaN substrate W.

The chamber 6 has a tubular chamber side portion 61 that is equipped with quartz chamber windows at its top and bottom. The chamber side portion 61 has a substantially tubular shape having top and bottom openings. The top opening is equipped with an upper chamber window 63 and is thus closed. The bottom opening is equipped with a lower chamber window 64 and is thus closed. The upper chamber window 63, forming the ceiling of the chamber 6, is a circular plate of quartz and serves as a quartz window that transmits flashes of light emitted from the flash heating part 5 into the chamber 6. The lower chamber window 64, forming the floor of the chamber 6, is also a circular plate of quartz and serves as a quartz window that transmits light emitted from the halogen heating part 4 into the chamber 6.

The chamber side portion 61 has an inner wall surface that is equipped with a reflective ring 68 in its upper portion and a reflective ring 69 in its lower portion. The reflective rings 68 and 69 are both annular. The upper reflective ring 68 is inserted from the top of the chamber side portion 61, thus being mounted. The lower reflective ring 69 is inserted from the bottom of the chamber side portion 61 and is then fastened with screws not shown, thus being mounted. In other words, the reflective rings 68 and 69 are removably mounted to the chamber side portion 61. The inner space of the chamber 6, i.e., a space surrounded by the upper chamber window 63, the lower chamber window 64, the chamber side portion 61, and the reflective rings 68 and 69, is defined as a heat treatment space 65.

The reflective rings 68 and 69 are mounted to the chamber side portion 61, thus forming a recessed portion 62 in the inner wall surface of the chamber 6. In other words, the recessed portion 62 is disposed in the inner wall surface of the chamber side portion 61 so as to be defined by the middle portion of the inner wall surface in which the reflective rings 68 and 69 are not disposed, the lower end surface of the reflective ring 68, and the upper end surface of the reflective ring 69. The recessed portion 62 is disposed in the form of a horizontal annular ring in the inner wall surface of the chamber 6, and surrounds the holder 7, which holds the GaN substrate W. The chamber side portion 61 and the reflective rings 68 and 69 are made of highly strong and heatproof metal (e.g., stainless steel).

The chamber side portion 61 has a transport opening (throat) 66 for transporting the GaN substrate W in and out of the chamber 6. The transport opening 66 is openable and closable by a gate valve 185. The transport opening 66 is connected in communication with the outer peripheral surface of the recessed portion 62. Thus, the gate valve 185, while opening the transport opening 66, allows the GaN substrate W to be transported through the transport opening 66 and the recessed portion 62 into and out of the heat treatment space 65. Closing the gate valve 185 encloses the heat treatment space 65 in the chamber 6.

The chamber side portion 61 further has a through hole 61a. The chamber side portion 61 includes a radiation thermometer 20 attached to its outer wall surface where the through-hole 61a is disposed. The through hole 61a is a cylindrical hole for directing, to the radiation thermometer 20, infrared light emitted from the lower surface of a placement plate 91 held by a susceptor 74. The susceptor 74 will be detailed later on. The through hole 61a is inclined with respect to a horizontal direction so that its longitudinal axis (an axis extending in a direction in which the through hole 61a extends through the chamber side portion 61) intersects a main surface of the susceptor 74. The through hole 61a has an end facing the heat treatment space 65. Attached to this end is a transparent window 21 of barium fluoride material that transmits infrared light in a measurable wavelength range with the radiation thermometer 20.

The chamber 6 has at least one gas supply opening 81 in the upper portion of its inner wall. The gas supply opening 81 is used for supplying a treatment gas therethrough into the heat treatment space 65. The gas supply opening 81 is disposed above the recessed portion 62; in some cases, the gas supply opening 81 may be disposed in the reflective ring 68. The gas supply opening 81 is connected in communication with a gas supply pipe 83 through a buffer space 82 disposed in the form of an annular ring inside the side wall of the chamber 6. The gas supply pipe 83 is connected to a treatment gas supply source 85. The gas supply pipe 83 includes a valve 84 inserted at some midpoint thereof. Opening the valve 84 feeds the treatment gas from the treatment gas supply source 85 to the buffer space 82. The treatment gas fed into the buffer space 82 spreads across the buffer space 82, which is lower in fluid resistance than the gas supply opening 81, to flow from the gas supply opening 81 into the heat treatment space 65. Examples of the treatment gas usable herein include ammonia ($NH_3$) and a forming gas, which is a mixed gas of hydrogen ($H_2$) and nitrogen ($N_2$). The treatment gas supply source 85 can supply an inert gas of nitrogen to the heat treatment space 65.

The chamber 6 also has at least one gas exhaust opening 86 in the lower portion of its inner wall. The gas exhaust opening 86 is used for exhausting a gas from the heat treatment space 65. The gas exhaust opening 86 is disposed below the recessed portion 62; in some cases, the gas exhaust opening 86 may be disposed in the reflective ring 69. The gas exhaust opening 86 is connected in communication with a gas exhaust pipe 88 through a buffer space 87 disposed in the form of an annular ring inside the side wall of the chamber 6. The gas exhaust pipe 88 is connected to an exhaust part 190. The gas exhaust pipe 88 includes a valve 89 inserted at some midpoint thereof. Opening the valve 89 exhausts the gas in the heat treatment space 65 from the gas exhaust opening 86 through the buffer space 87 to the gas exhaust pipe 88. It is noted that the at least one gas supply opening 81 and the at least one gas exhaust opening 86 may respectively include a plurality of gas supply openings 81 and a plurality of gas exhaust openings 86 arranged in the circumferential direction of the chamber 6, or may be provided in the form of slits. It is also noted that the treatment gas supply source 85 and the exhaust part 190 may be mechanisms disposed in the heat treatment apparatus 1 or be utility systems in a factory in which the heat treatment apparatus 1 is installed.

The transport opening 66 has a distal end connected to a gas exhaust pipe 191 for exhausting the gas from the heat treatment space 65. The gas exhaust pipe 191 is connected to the exhaust part 190 via a valve 192. Opening the valve 192 exhausts the gas in the chamber 6 through the transport opening 66.

Figure 2:
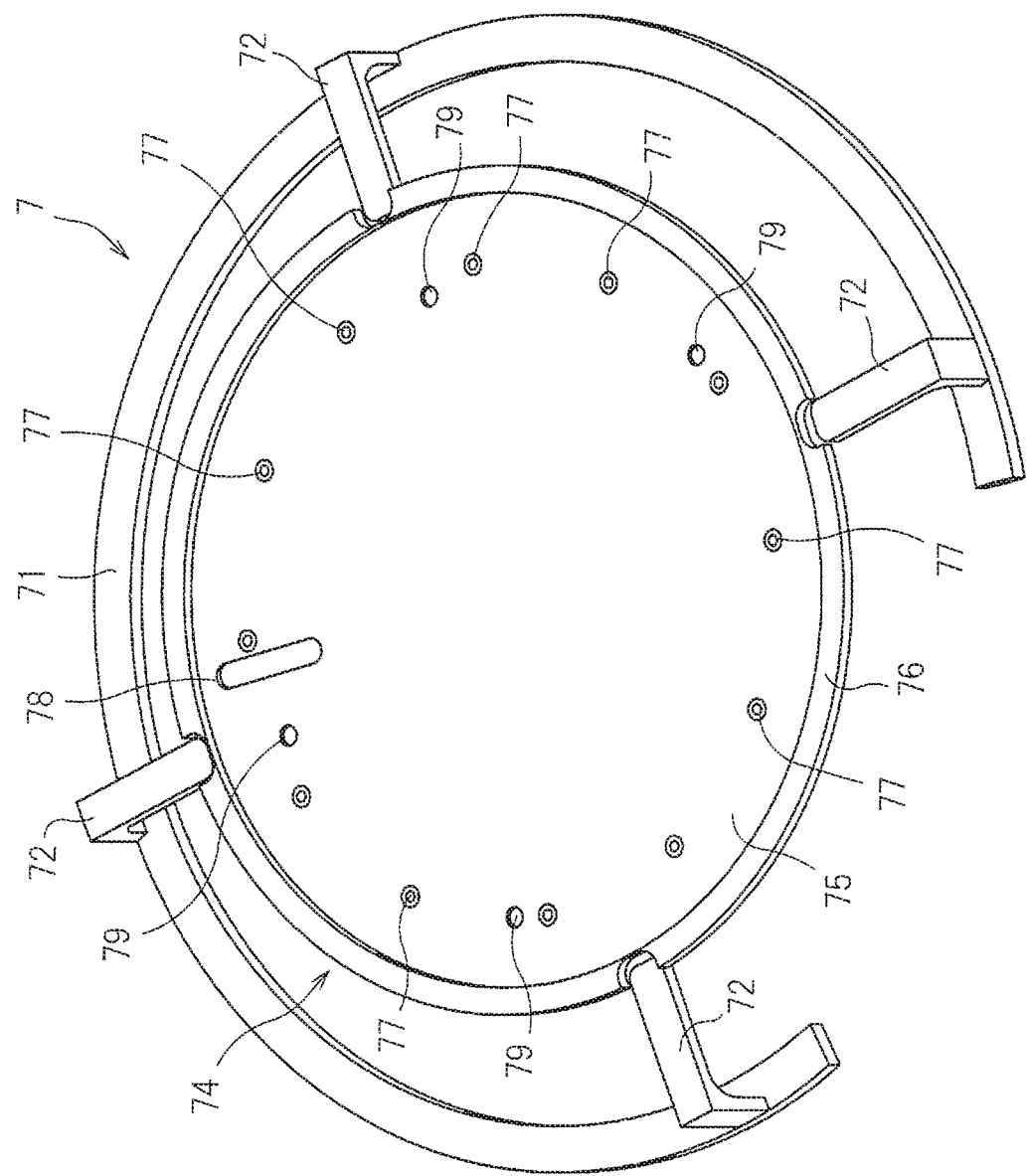
FIG. 2 is an external perspective view illustrating the entire appearance of a holder.

FIG. 2 is an external perspective view illustrating the entire appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape part of which is removed from an annular shape. This removed part is provided to prevent interference between transfer arms 11 of the transfer mechanism 10 and the base ring 71. The transfer arms 11 will be detailed later on. The base ring 71 is placed on the bottom surface of the recessed portion 62, and is thus supported by the wall surface of the chamber 6 (c.f., FIG. 1). The base ring 71 has an upper surface on which the coupling portions 72 (four coupling portions in the preferred embodiment) are arranged in the circumferential direction of its annular shape. The coupling portions 72 are quartz members, and are rigidly secured to the base ring 71 through welding.

Figure 3:
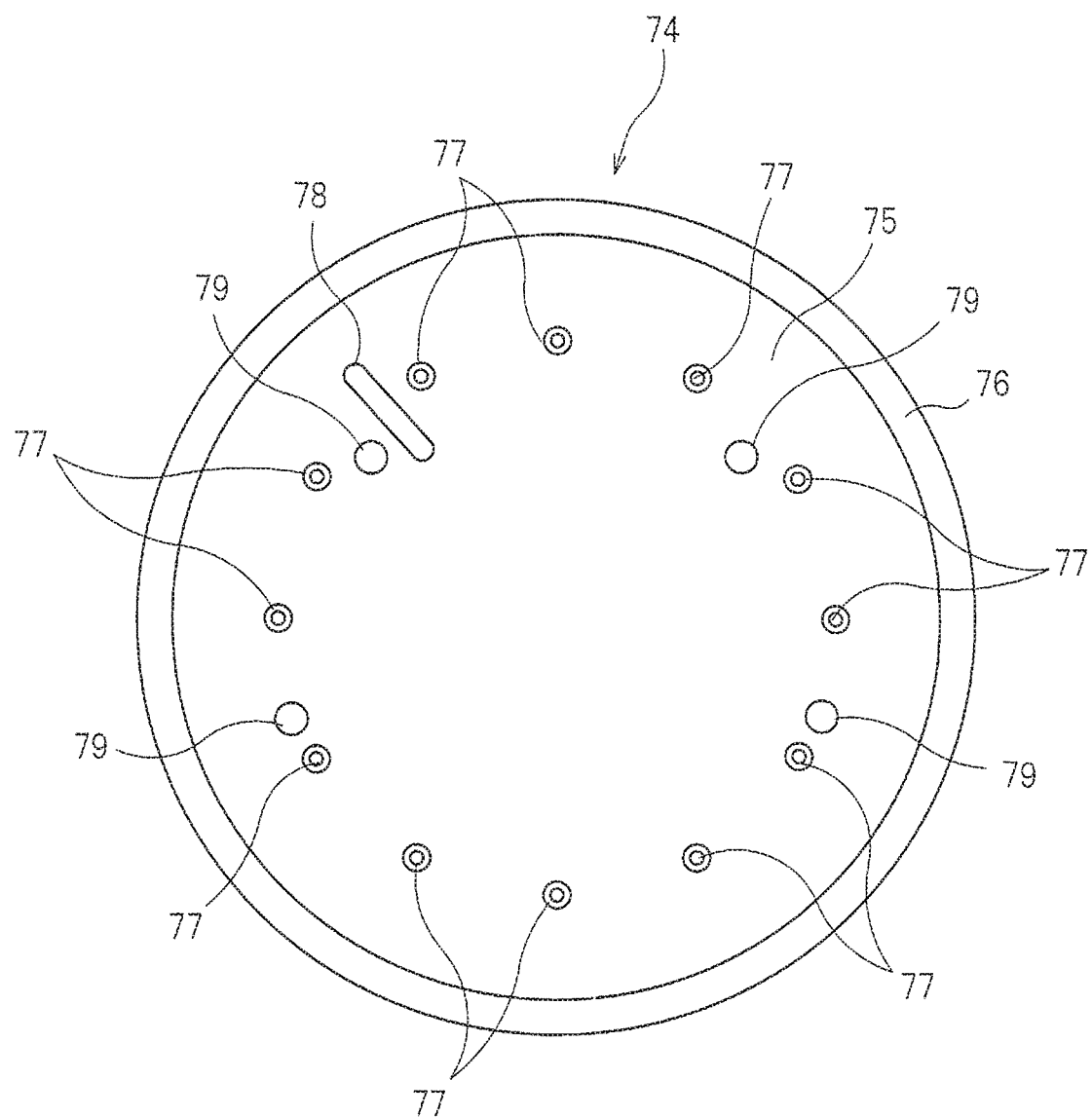
FIG. 3 is a plan view of a susceptor.

The susceptor 74 is supported by the four coupling portions 72 disposed on the base ring 71. FIG. 3 is a plan view of the susceptor 74. FIG. 4 is a cross-sectional view of the susceptor 74. The susceptor 74 includes a holding plate 75, a guide ring 76, and a plurality of support pins 77. The holding plate 75 is a flat quartz plate having a substantially circular shape. The diameter of the holding plate 75 is greater than that of the GaN substrate W. In other words, the holding plate 75 is larger than the GaN substrate W in plan view.

The guide ring 76 is disposed on the periphery of the upper surface of the holding plate 75. The guide ring 76 is an annular member having an inner diameter greater than the diameter of the placement plate 91 (c.f., FIG. 9), on which the GaN substrate W is placed. For example, when the diameter of the placement plate 91 is 300 mm, the inner diameter of the guide ring 76 is 320 mm. The inner periphery of the guide ring 76 is such a tapered surface as to become wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and other members. Alternatively, the holding plate 75 and the guide ring 76 may be machined as an integral member.

The upper surface of the holding plate 75 has a region inside the guide ring 76. This inside region serves as a planar holding surface 75a that holds the placement plate 91 with the GaN substrate W placed thereon. The support pins 77 are arranged upright on the holding surface 75a of the holding plate 75. In the preferred embodiment, 12 support pins 77 in total are spaced at intervals of 30 degrees along the circumference of a circle concentric with the outer circumference of the holding surface 75a (the inner circumference of the guide ring 76). The diameter of the circle on which the 12 support pins 77 are disposed (the distance between opposed ones of the support pins 77) is smaller than the diameter of the placement plate 91, and is 270 to 280 mm (in the preferred embodiment, 270 mm) when the placement plate 91 is 300 mm in diameter. The support pins 77 are made of quartz. The support pins 77 may be welded to the upper surface of the holding plate 75 or machined integrally with the holding plate 75.

Referring back to FIG. 2, the four coupling portions 72 arranged upright on the base ring 71, and the peripheral portion of the holding plate 75 of the susceptor 74 are rigidly secured to each other by welding. In other words, the susceptor 74 and the base ring 71 are fixedly coupled to each other with the coupling portions 72. In this way, the base ring 71 of the holder 7 is supported by the wall surface of the chamber 6, whereby the holder 7 is mounted to the chamber 6. With the holder 7 mounted to the chamber 6, the holding plate 75 of the susceptor 74 takes a horizontal attitude (an attitude such that the normal to the holding plate 75 coincides with a vertical direction). In other words, the holding surface 75a of the holding plate 75 becomes a horizontal surface.

The placement plate 91 with the GaN substrate W placed thereon is placed and held in a horizontal attitude on the susceptor 74 of the holder 7 mounted to the chamber 6. At this time, the placement plate 91 is supported by the 12 support pins 77 arranged upright on the holding plate 75, and is thus held by the susceptor 74. More strictly speaking, the 12 support pins 77 have their upper end portions coming in contact with the lower surface of the placement plate 91 to support the placement plate 91. The 12 support pins 77 have a uniform height (distance from the upper ends of the support pins 77 to the holding surface 75a of the holding plate 75). Hence, the 12 support pins 77 support the placement plate 91 in a horizontal attitude.

The placement plate 91 supported by the support pins 77 is spaced a predetermined distance apart from the holding surface 75a of the holding plate 75. The thickness of the guide ring 76 is greater than the height of the support pins 77. Thus, the guide ring 76 prevents the horizontal misregistration of the placement plate 91 supported by the support pins 77.

As illustrated in FIGS. 2 and 3, the holding plate 75 of the susceptor 74 has an opening 78 extending vertically through the holding plate 75. The opening 78 is provided for the radiation thermometer 20 to receive light (infrared light) emitted from the lower surface of the placement plate 91. In other words, the radiation thermometer 20 receives the light emitted from the lower surface of the placement plate 91 via the opening 78 and the transparent window 21, which is mounted to the through hole 61a in the chamber side portion 61, to measure the temperature of the placement plate 91. Further, the holding plate 75 of the susceptor 74 has four through holes 79 through which respective lift pins 12 of the transfer mechanism 10 pass for transfer of the placement plate 91. The lift pins 12 will be detailed later on.

Figure 5:
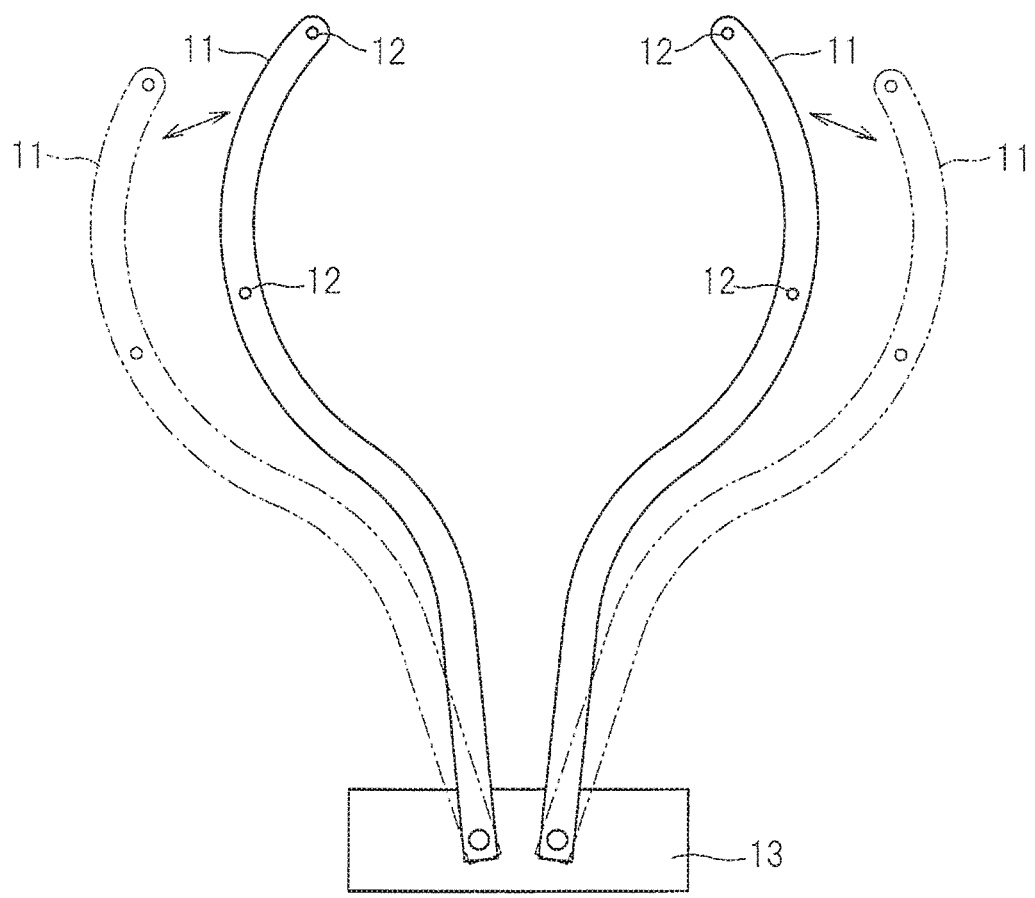
FIG. 5 is a plan view of a transfer mechanism.
Figure 6:
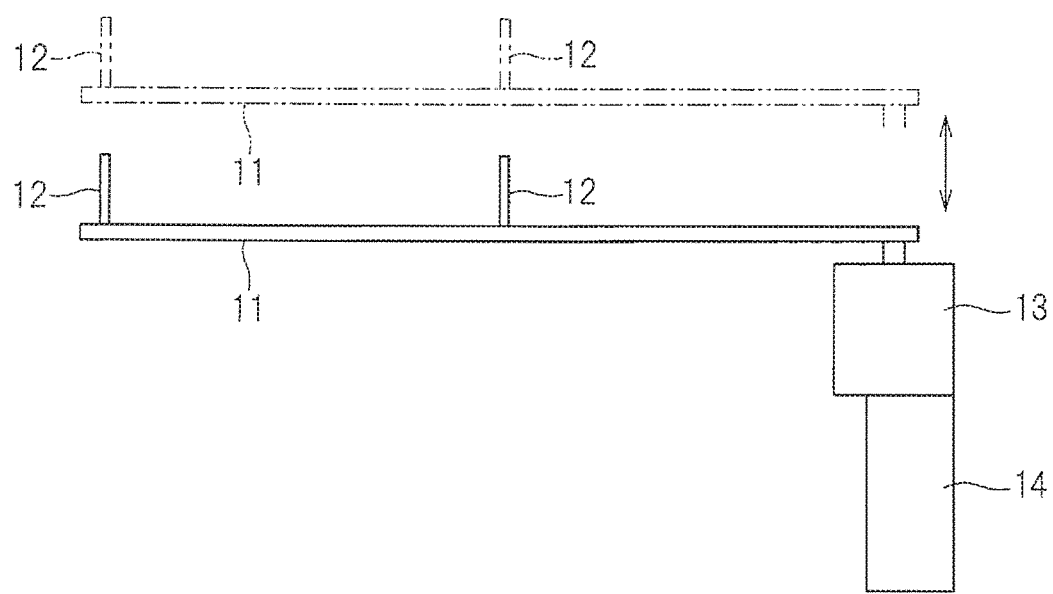
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. The transfer arms 11 each include the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the placement plate 91 is transferred to and from the holder 7, and a retracted position (a position indicated by dash-double-dot lines in FIG. 5) in which the transfer arms 11 do not overlap, in plan view, the placement plate 91 held by the holder 7. The horizontal movement mechanism 13 may be of the type which causes individual motors to pivot the respective transfer arms 11 or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (c.f., FIGS. 2 and 3) bored in the susceptor 74, so that the upper ends of the lift pins 12 protrude from the upper surface of the susceptor 74. In contrast, as the elevating mechanism 14 moves down the pair of transfer arms 11 in their transfer operation position to take the lift pins 12 out of the respective through holes 79, and the horizontal movement mechanism 13 moves the pair of transfer arms 11 so as to expand the transfer arms 11, the transfer arms 11 move to their retracted position. The retracted position of the pair of transfer arms 11 is immediately over the base ring 71 of the holder 7. Since the base ring 71 is placed on the bottom surface of the recessed portion 62, the retracted position of the transfer arms 11 is inside the recessed portion 62. An exhaust mechanism not shown is also disposed near the location where the drivers (i.e., the horizontal movement mechanism 13 and the elevating mechanism 14) of the transfer mechanism 10 are disposed. The exhaust mechanism is configured to exhaust an atmosphere around the drivers of the transfer mechanism 10 to the outside of the chamber 6.

Referring back to FIG. 1, the flash heating part 5 over the chamber 6 includes an enclosure 51, a light source disposed inside the enclosure 51 and including the multiple (in the present preferred embodiment, 30) xenon flash lamps FL, and a reflector 52 disposed inside the enclosure 51 so as to cover the light source from above. The flash heating part 5 also includes a lamp light radiation window 53 mounted on the bottom of the enclosure 51. The lamp light radiation window 53, forming the floor of the flash heating part 5, is a plate-like quartz window. The flash heating part 5 is disposed over the chamber 6, whereby the lamp light radiation window 53 is opposed to the upper chamber opening 63. The flash lamps FL direct flashes of light from over the chamber 6 through the lamp light radiation window 53 and the upper chamber window 63 to the heat treatment space 65.

The flash lamps FL are each a rod-shaped lamp having an elongated cylindrical shape and are arranged in a plane in such a manner that their longitudinal directions are in parallel with each other along a main surface of the GaN substrate W held by the holder 7 (i.e., in a horizontal direction). Thus, the plane defined by the arrangement of the flash lamps FL is also a horizontal plane. A region in which the flash lamps FL are arranged is larger than the semiconductor wafer W in plan view.

The xenon flash lamps FL each include a cylindrical glass tube (discharge tube) containing xenon gas sealed therein, and having positive and negative electrodes disposed on the opposite ends thereof and connected to a capacitor. The xenon flash lamps FL each also include a trigger electrode attached to the outer peripheral surface of the glass tube. Since xenon gas is an electrical insulator, no current flows through the glass tube in a normal state even when an electrical charge accumulates in the capacitor. However, if high-voltage application to the trigger electrode produces an electrical breakdown, electricity stored in the capacitor flows momentarily through the glass tube, and xenon atoms or molecules are excited at this time to cause light emission. Such a xenon flash lamp FL has the property of being capable of emitting extremely intense light as compared with a light source that stays lit continuously such as a halogen lamp HL, because the electrostatic energy previously stored in the capacitor is converted into an ultrashort light pulse ranging from 0.1 to 100 milliseconds. In other words, the flash lamps FL are pulsed light emitting lamps that emit light instantaneously for an extremely short time period of less than one second. The light emission time of the flash lamps FL is adjustable by the coil constant of a lamp light source that supplies power to the flash lamps FL.

The reflector 52 is disposed over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. The reflector 52 has a surface (surface facing the flash lamps FL) roughened by abrasive blasting.

The halogen heating part 4 under the chamber 6 includes an enclosure 41 incorporating the multiple (in the present preferred embodiment, 40) halogen lamps HL. The halogen heating part 4 directs light from under the chamber 6 through the lower chamber window 64 to the heat treatment space 65 to heat the GaN substrate W by means of the halogen lamps HL.

FIG. 7 is a plan view illustrating an arrangement of the multiple halogen lamps HL. The 40 halogen lamps HL are arranged in two tiers, i.e., upper and lower tiers. Specifically, 20 of the halogen lamps HL are arranged in the upper tier closer to the holder 7, and the remaining 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged in such a manner that their longitudinal directions are in parallel with each other along a main surface of the GaN substrate W held by the holder 7 (i.e., in a horizontal direction). Thus, a plane defined by the arrangement of the halogen lamps HL in each of the upper and lower tiers is also a horizontal plane.

As illustrated in FIG. 7, the halogen lamps HL in each of the upper and lower tiers are disposed at a higher density in a region opposed to the peripheral portion of the placement plate 91 held by the holder 7 than in a region opposed to the central portion of the placement plate 91. In other words, the halogen lamps HL in each of the upper and lower tiers are arranged at shorter intervals in the peripheral portion of the lamp arrangement than in the central portion thereof. This allows a greater amount of light to impinge upon the peripheral portion of the placement plate 91 where a temperature decrease is prone to occur when the placement plate 91 is heated by irradiation with the light from the halogen heating part 4.

The group of halogen lamps HL in the upper tier and the group of halogen lamps HL in the lower tier are arranged to intersect each other in a lattice pattern. In other words, the 40 halogen lamps HL in total are arranged in such a manner that the longitudinal direction of the 20 halogen lamps HL in the upper tier and the longitudinal direction of the 20 halogen lamps HL in the lower tier are orthogonal to each other.

Each of the halogen lamps HL is a filament light source that passes current through a filament disposed in a glass tube to make the filament incandescent, thereby emitting light. What is sealed in the glass tube is a gas prepared by introducing a halogen element (e.g., iodine and bromine) in trace amounts into an inert gas (e.g., nitrogen and argon). The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In other words, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the placement plate 91 disposed over the halogen lamps HL.

The halogen heating part 4 includes a reflector 43 also inside the enclosure 41, under the halogen lamps HL arranged in two tiers (FIG. 1). The reflector 43 reflects the light emitted from the halogen lamps HL toward the heat treatment space 65.

The controller 3 controls the aforementioned various operating mechanisms disposed in the heat treatment apparatus 1. The controller 3 is similar in hardware configuration to a typical computer. In other words, the controller 3 includes a CPU, which is a circuit for performing various computation processes, a ROM or read-only memory for storing a basic program therein, a RAM or readable and writable memory for storing various pieces of information therein, and a magnetic disk for storing control software, data and other things thereon. The CPU in the controller 3 executes a predetermined processing program, whereby the process in the heat treatment apparatus 1 proceeds.

The heat treatment apparatus 1 further includes, in addition to the aforementioned components, various cooling structures to prevent an excessive temperature rise in the halogen heating part 4, flash heating part 5, and chamber 6 because of the heat energy that is generated from the halogen lamps HL and the flash lamps FL during the heat treatment of the GaN substrate W. For instance, the walls of the chamber 6 are provided with water cooling tubes (not shown). In addition, the halogen heating part 4 and the flash heating part 5 have an air cooling structure for forming a gas flow therein to exhaust heat. Air is supplied to the gap between the upper chamber window 63 and the lamp light radiation window 53 to cool down the flash heating part 5 and the upper chamber window 63.

Figure 8:
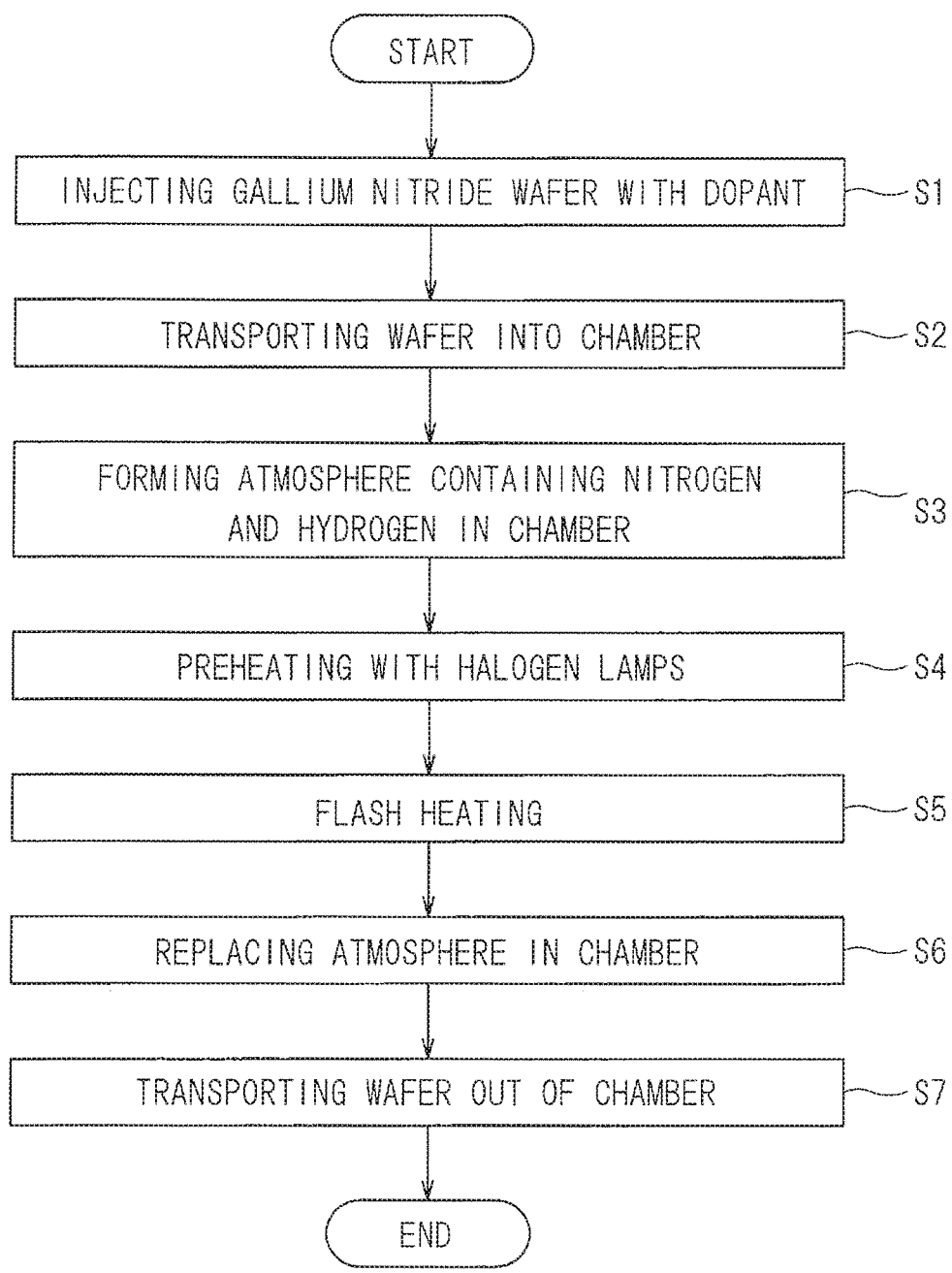
FIG. 8 is a flowchart showing process steps of a method for fabricating a p-type gallium nitride semiconductor according to the preferred embodiment.

The following describes how to fabricate the p-type gallium nitride semiconductor according to the preferred embodiment. FIG. 8 is a flowchart showing process steps for fabricating the p-type gallium nitride semiconductor according to the preferred embodiment. Magnesium (Mg), which is a p-type dopant, is injected into a GaN substrate W to be treated, through a publicly known ion implantation method (step S1). This p-type dopant injection is performed with an ion implanter different from the heat treatment apparatus 1. The condition for the p-type dopant injection (such as dose and injection energy) can be any proper value. In addition, a technique "high-temperature injection" may be used in which the temperature of the GaN substrate W in the p-type dopant injection is set to be high.

Figure 9:
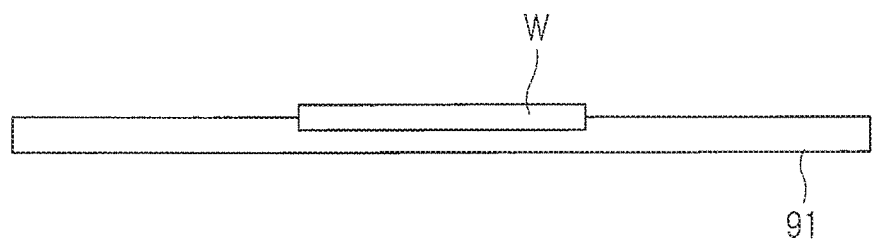
FIG. 9 is a diagram illustrating a GaN substrate placed on a placement plate.

The GaN substrate W to be treated is a gallium nitride wafer that is a circular plate with a diameter of about 50 mm (2 inches) and is noticeably smaller than a typical silicon semiconductor wafer (300 mm in diameter). Hence, in the preferred embodiment, the GaN substrate W placed on the placement plate 91 undergoes processing in the heat treatment apparatus 1. FIG. 9 is a diagram illustrating the GaN substrate W placed on the placement plate 91. The placement plate 91 is a circular plate having a diameter of 300 mm. The placement plate 91 is made of silicon carbide (SiC) for instance. The placement plate 91 has, in the middle portion of its upper surface, a circular recessed portion having a diameter of about 50 mm. The GaN substrate W is fitted and thus placed in this circular recessed portion. The GaN substrate W placed on the placement plate 91 then undergoes heating in the heat treatment apparatus 1. The placement plate 91 is as large as a typical silicon semiconductor wafer. This enables the GaN substrate W to be heated by the heat treatment apparatus 1 that processes a silicon semiconductor wafer. The following describes how to heat the GaN substrate W with the heat treatment apparatus 1. The following process in the heat treatment apparatus 1 proceeds under the control of the controller 3 over the individual operation mechanisms of the heat treatment apparatus 1.

First, the GaN substrate W placed on the placement plate 91 is transported into the chamber 6 of the heat treatment apparatus 1 (step S2). To be specific, the gate valve 185 is opened to unlock the transport opening 66, and a transport robot outside the heat treatment apparatus 1 transports the placement plate 91 with the GaN substrate W placed thereon, through the transport opening 66 into the heat treatment space 65 in the chamber 6. At this time, the valve 84 may be opened to supply nitrogen gas into the chamber 6, so that the nitrogen gas can flow out of the transport opening 66 to minimize an external atmosphere that is taken in the heat treatment space 65 when the GaN substrate W is transported.

The placement plate 91 transported by the transport robot moves to a location directly above the holder 7 and then stops. Then, the pair of transfer arms 11 of the transfer mechanism 10 horizontally moves from their retracted position to their transfer operation position and then moves up, whereby the lift pins 12 pass through the through-holes 79 to protrude from the upper surface of the holding plate 75 of the susceptor 74 to receive the placement plate 91 with the GaN substrate W placed thereon. At this time, the lift pins 12 move up to a higher position than the upper ends of the support pins 77.

After the placement plate 91 with the GaN substrate W placed thereon is placed onto the lift pins 12, the transport robot retracts from the heat treatment space 65, and the gate valve 185 closes the transport opening 66. The pair of transfer arms 11 then moves down, whereby the placement plate 91 is transported from the transfer mechanism 10 to the susceptor 74 of the holder 7 and is held in a horizontal attitude from below. The placement plate 91 is supported by the plurality of support pins 77 mounted upright on the holding plate 75, and is thus held by the susceptor 74. The placement plate 91 is held by the holder 7, with the front surface of the GaN substrate W injected with the p-type dopant being oriented upward. The back surface (surface opposite to the surface on which the GaN substrate W is placed) of the placement plate 91 supported by the support pins 77 is spaced a predetermined interval away from the holding surface 75a of the holding plate 75. The pair of transfer arms 11 moved down below the susceptor 74 is retracted in their retracted position, i.e., inside the recessed portion 62, by the horizontal movement mechanism 13.

Subsequently, after the gate valve 185 closes the transport opening 66 to enclose the heat treatment space 65, an atmosphere containing nitrogen and hydrogen is formed in the chamber 6 (step S3). In the present invention, the atmosphere containing nitrogen and hydrogen is an atmosphere containing nitrogen and hydrogen as elements. In other words, the atmosphere containing nitrogen and hydrogen does not necessarily have to contain nitrogen molecules ($N_2$) and hydrogen molecules ($H_2$). In the preferred embodiment, the valve 84 is opened to supply ammonia ($NH_3$) as a treatment gas from the treatment gas supply source 85 to the heat treatment space 65. This ammonia contains nitrogen and hydrogen as elements. The valve 89 is opened to exhaust the gas in the chamber 6, from the gas exhaust opening 86. Accordingly, the treatment gas in the chamber 6, supplied from above the heat treatment space 65, flows downward to exhaust from the lower portion of the heat treatment space 65, and the interior of the chamber 6 is thus replaced with an atmosphere of ammonia. The ammonia concentration within the atmosphere of ammonia formed in the chamber 6 can be an appropriate value, and may be 100% for instance. It is noted that to enhance replacement efficiency, the interior of the chamber 6 may be once decompressed to less than atmospheric pressure and may then be supplied with ammonia.

After the atmosphere of ammonia is formed in the chamber 6, the 40 halogen lamps HL of the halogen heating part 4 are all turned on simultaneously to start preheating, i.e., assist-heating (step S4). The halogen light emitted from the halogen lamps HL passes through the lower chamber window 64 and the susceptor 74, both of which are made of quartz, to impinge on the lower surface of the placement plate 91 with the GaN substrate W placed thereon. The placement plate 91, which is made of SiC, well absorbs the light emitted from the halogen lamps HL to raise its temperature. Heat from the placement plate 91 with raised temperature transfers to the GaN substrate W, thus preheating the GaN substrate W. The transfer arms 11 of the transfer mechanism 10, which are retracted inside the recessed portion 62, do not become an obstacle to the heating with the halogen lamps HL.

The temperature of the placement plate 91 with the GaN substrate W placed thereon is measured with the radiation thermometer 20 when the halogen lamps HL perform the preheating. In other words, the radiation thermometer 20 receives, through the transparent window 21, the infrared light emitted from the lower surface of the placement plate 91 held by the susceptor 74 through the opening 78, to measure the temperature of the placement plate 91 that is on the increase. The measured temperature of the placement plate 91 is transmitted to the controller 3. The controller 3 controls the output from the halogen lamps HL while monitoring whether the temperature of the placement plate 91 that is on the increase by the irradiation with the light from the halogen lamps HL, has reached a target temperature T1. In other words, the controller 3 effects feedback control of the output from the halogen lamps HL so that the temperature of the placement plate 91 is equal to the target temperature T1, on the basis of the value measured with the radiation thermometer 20. The target temperature T1 is 900° C. or higher and 1000° C. or lower.

After the temperature of the placement plate 91 reaches the target temperature T1, the controller 3 regulates the output from the halogen lamps HL in such a manner that the temperature of the placement plate 91 keeps at the target temperature T1. To be specific, the controller 3 regulates the output from the halogen lamps HL at the time when the temperature of the placement plate 91 measured with the radiation thermometer 20 reaches the target temperature T1, to keep the temperature of the placement plate 91 at about the target temperature T1. The irradiation of the light from the halogen lamps HL keeps the temperature of the placement plate 91 at the target temperature T1. Accordingly, the GaN substrate W is uniformly preheated by the heat conducted from the placement plate 91.

The front surface of the GaN substrate W undergoes irradiation with the flashes of light from the flash lamps FL of the flash heating part 5 after an elapse of a predetermined time from when the temperature of the placement plate 91 reaches the target temperature T1 (step S5). At this time, part of the flashes of light from the flash lamps FL travel directly toward the interior of the chamber 6. The remainder of the flashes of light are reflected once from the reflector 52, and then travel toward the interior of the chamber 6. The irradiation of the GaN substrate W with such flashes of light achieves the flash heating of the GaN substrate W.

The flash heating, which is performed by the emission of flashes of light from the flash lamps FL, can increase the temperature of the front surface of the GaN substrate W in a short time. In other words, the flashes of light from the flash lamps FL are each an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the GaN substrate W injected with the p-type dopant through the irradiation with the flashes of light from the flash lamps FL, increases momentarily to a treatment temperature T2 and thereafter decreases rapidly. The treatment temperature T2 is higher than the aforementioned target temperature T1, and is 1400° C. or higher. Momentarily heating the front surface of the GaN substrate W to the treatment temperature T2 activates the injected p-type dopant. Since the dopant activation requires a super-short time, the p-type dopant is sufficiently activated even through short-time flash heating.

It is known that heating gallium nitride to a high temperature relatively easily removes nitrogen therefrom. Accordingly, attempts have been made to prevent nitrogen removal by, for instance, forming a cap layer onto a surface of gallium nitride. In the preferred embodiment, the front surface of the GaN substrate W is flash-heated from the target temperature T1 to the treatment temperature T2 by directing the flashes of light to the GaN substrate W for an extremely short time. Hence, the GaN substrate W is under high temperature for a short time, thus minimizing such nitrogen removal. The GaN substrate W is flash-heated from the target temperature T1 to the treatment temperature T2 in the atmosphere of ammonia (i.e., a nitrogen-containing atmosphere). Even if nitrogen is slightly removed, such a configuration enables heat treatment while complementing the removed nitrogen from the atmosphere of ammonia. This prevents nitrogen shortage in the GaN substrate W without forming a cap layer and other things, thus enhancing the activation efficiency of the p-type dopant.

In the preferred embodiment, the GaN substrate W is flash-heated in the atmosphere of ammonia (i.e., a hydrogen-containing atmosphere). Such a configuration enables heat treatment while supplying hydrogen to GaN. This activates the p-type dopant injected into the GaN substrate W with high efficiency.

In the preferred embodiment, the front surface of the GaN substrate W is heated to a high temperature of 1400° C. or higher through flash-heating. This recovers crystal defects in the GaN substrate W resulting from the dopant injection, thereby enhancing the activation efficiency of the p-type dopant.

After the p-type dopant is activated through the flash-heating, the atmosphere in the chamber 6 is replaced (step S6). This process step specifically includes a step of closing the valve 84 as well as opening the valve 89 to exhaust the atmosphere of ammonia in the chamber 6 to decompress the interior of the chamber 6 to less than atmospheric pressure, followed by opening the valve 84 to supply nitrogen into the chamber 6. This replaces the atmosphere of ammonia in the chamber 6 with an atmosphere of nitrogen, which is an inert gas.

The halogen lamps HL are then turned off, whereby the temperature of the GaN substrate W and the temperature of the placement plate 91 rapidly drop. The temperature of the placement plate 91 during temperature dropping is measured with the radiation thermometer 20, and the measurement result is transmitted to the controller 3. On the basis of the measurement result in the radiation thermometer 20, the controller 3 monitors whether the temperature of the placement plate 91 has dropped to a predetermined temperature. After the temperature of the placement plate 91 drops to equal to or less than the predetermined temperature, the pair of transfer arms 11 of the transfer mechanism 10 again horizontally moves from their retracted position to their transfer operation position and then moves up, so that the lift pins 12 protrude from the upper surface of the susceptor 74 to receive the placement plate 91 with the GaN substrate W after heat treatment placed thereon, from the susceptor 74. Subsequently, the closed transport opening 66 is unlocked by the gate valve 185, and the transfer robot transports the placement plate 91 placed on the lift pins 12, to the outside; this completes the process of heating the GaN substrate W in the heat treatment apparatus 1 (step S7).

In the preferred embodiment, the front surface of the GaN substrate W injected with the p-type dopant is flash-heated to a high temperature of 1400° C. or higher through irradiation with the flashes of light in the atmosphere containing nitrogen and hydrogen. Such a heating process prevents nitrogen shortage in the GaN substrate W during heat treatment. This heating process also enables heat treatment while supplying hydrogen to the GaN substrate W. The heating process further enables the crystal defects in the GaN substrate W to be recovered. With these effects, the p-type dopant injected into the GaN substrate W is activated with high efficiency, thus achieving the fabrication of a p-type gallium nitride semiconductor of high quality.

The aforementioned effects eliminate the need to form a cap layer and other things for avoiding nitrogen removal from the GaN substrate W, thereby reducing manufacture costs.

While the preferred embodiment of the present invention has been described hereinabove, various modifications of the present invention in addition to those described above may be made without departing from the scope and spirit of the invention. Although the foregoing preferred embodiment describes, by way of example, that the GaN substrate W undergoes flash-heating in the atmosphere of ammonia, the GaN substrate W may undergo flash-heating through irradiation with flashes of light in an atmosphere containing a forming gas, which is a mixed gas of hydrogen and nitrogen. The forming-gas atmosphere is also an atmosphere containing nitrogen and hydrogen as elements. Flash-heating the GaN substrate W through irradiation with the flashes of light in the forming-gas atmosphere achieves effects similar to those described in the foregoing preferred embodiment, thereby activating the p-type dopant with high efficiency. The concentration of hydrogen within the forming gas is 4% at maximum. In short, the GaN substrate W needs to be heated through irradiation with the flashes of light in the atmosphere containing nitrogen and hydrogen.

The size of the GaN substrate W is not limited to about 50 mm in diameter; for instance, it may be about 100 mm (4 inches) in diameter.

The material for the placement plate 91 is not limited to silicon carbide; for instance, it may be silicon (Si). As a matter of course, the placement plate 91 of silicon (whose melting point is 1414° C.), can possibly melt when the GaN substrate W is heated to a high temperature of 1400° C. or higher during the flash heating; hence the placement plate 91 is preferably made of silicon carbide (whose melting point is 2730° C.).

Although the foregoing preferred embodiment describes, by way of example, that the flash heating part 5 includes the 30 flash lamps FL, the flash heating part 5 can include any number of flash lamps FL. Further, the flash lamps FL are not limited to xenon flash lamps; they may be krypton flash lamps. Still further, the number of halogen lamps HL included in the halogen heating part 4 is not limited to 40. Any number of halogen lamps HL may be provided.

In the foregoing preferred embodiment, the filament halogen lamps HL are used as continuous lighting lamps that emit light continuously for not less than one second, to preheat the GaN substrate W. The present invention, however, is not limited to this. In place of the halogen lamps HL, are discharge lamps (e.g., xenon arc lamps) may be used as the continuous lighting lamps to perform the preheating.

While the invention has been shown and described in detail, the foregoing description is in all aspects illustrative and not restrictive. It is therefore understood that numerous modifications and variations can be devised without departing from the scope of the invention.

What is claimed is:

1. A method for fabricating a p-type gallium nitride semiconductor, comprising the steps of:
    (a) injecting a p-type dopant into a substrate of gallium nitride; and
    (b) heating the substrate by irradiating the substrate with a flash of light from a flash heating part for 0.1 millisecond or more and less than one second in an atmosphere containing nitrogen and hydrogen, the flash of light from the flash heating part covering entirety of the main surface of the substrate at once.

2. The method according to claim 1, wherein the atmosphere containing nitrogen and hydrogen is an atmosphere of ammonia.

3. The method according to claim 1, wherein the atmosphere containing nitrogen and hydrogen is a forming-gas atmosphere.

4. A method for heating a gallium nitride substrate, comprising the steps of:
    (a) transporting a substrate of gallium nitride injected with a p-type dopant into a chamber;
    (b) forming, in the chamber, an atmosphere containing nitrogen and hydrogen; and
    (c) heating the substrate by irradiating the substrate with a flash of light from a flash heating part for 0.1 millisecond or more and less than one second, the flash of light from the flash heating part covering entirety of the main surface of the substrate at once.

5. The method according to claim 4, wherein the atmosphere containing nitrogen and hydrogen is an atmosphere of ammonia.

6. The method according to claim 4, wherein the atmosphere containing nitrogen and hydrogen is a forming-gas atmosphere.

* * * * *